United States Patent
Ting

(10) Patent No.: US 7,566,233 B2
(45) Date of Patent: Jul. 28, 2009

(54) CARD CONNECTOR

(75) Inventor: Chien-Jen Ting, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/151,568

(22) Filed: May 7, 2008

(65) Prior Publication Data

US 2008/0280487 A1 Nov. 13, 2008

(30) Foreign Application Priority Data

May 7, 2007 (TW) .............................. 96116057 A

(51) Int. Cl.
*H01R 13/62* (2006.01)
(52) U.S. Cl. ........................ 439/159; 439/630; 439/157
(58) Field of Classification Search ................ 439/157, 439/159, 630–632
See application file for complete search history.

(56) References Cited

U.S. PATENT DOCUMENTS

| | | |
|---|---|---|
| 5,533,906 A | 7/1996 | Abe |
| 5,655,918 A | 8/1997 | Soh |
| 5,980,282 A * | 11/1999 | Cheng .......................... 439/157 |
| 6,030,238 A | 2/2000 | Dong |
| 6,036,511 A * | 3/2000 | Hashimoto .................. 439/159 |
| 6,095,834 A * | 8/2000 | Lai et al. ..................... 439/159 |
| 6,210,188 B1 * | 4/2001 | Chang ......................... 439/159 |
| 6,988,904 B1 | 1/2006 | Lai |
| 7,090,537 B1 | 8/2006 | Nakamura |
| 2006/0246757 A1 | 11/2006 | Ting |

* cited by examiner

*Primary Examiner*—Truc T Nguyen
(74) *Attorney, Agent, or Firm*—Wei Te Chung

(57) ABSTRACT

A card connector includes an insulating housing, a plurality of terminals, a shell and an ejecting mechanism. The insulating housing defines a base, a corner portion juxtaposed with the base and a guiding plate extending forwardly from the corner portion. The terminals are received in the base of the insulating housing. The shell covers the insulating housing to define a card slot and a card insertion direction. The guiding plate of the insulating housing extends in the card slot in a particular direction intersecting the insertion direction. The ejecting mechanism has an ejecting member to be engaged with the card and move together with the card, a pushing member for moving the ejecting member towards the removing direction, a rotary member placed on the corner portion and having a rotation center and rotatable around the rotation center. The rotation center is disposed on the corner portion.

12 Claims, 5 Drawing Sheets

CARD CONNECTOR

BACKGROUND OF THE INVENTION

1. Field of the Invention

The present invention relates to a structure of a card connector used for memory cards for use in various portable information terminals, such as a portable telephone or a PC, or memory support equipments such as a digital camera or a digital AV equipment.

2. Description of Prior Arts

A card connector is generally used as an expanded recording apparatus of an electronic equipment such as a personal computer or a digital camera. As a storage medium of the card connector, a PC card or a memory card has come into wide use.

For example, a card called an express card is used as an object to be connected to a card connector. The express card is produced in accordance with a card standard defined by PCMCIA (Personal Computer Memory Card International Association) and has two types including a narrow card/34 module and a wide card/54 module. Therefore, a card connector used for connection of the express card is desired to be connectable to both of the two types of cards.

U.S. Pat. No. 7,090,537, for example, discloses a card connector which has a shell and an insulating housing receiving a plurality of terminals, the shell covering the insulating housing to define a receiving space. The receiving space defines a front portion allowing a card to be inserted and a back portion opposite to the front portion, and the front portion is wider than the back portion along a transverse direction perpendicular to the insertion direction of the card. Accordingly, the shell of the card connector is structured as an L-shaped. However, since the shell is configured in such type, it is necessary to design another model for the shell. So it is an object of the present invention to provide a card connector that is more simple to design.

SUMMARY OF THE INVENTION

An object, therefore, of the invention is to provide a card connector which is more simple to design.

In the exemplary embodiment of the invention, an card connector includes an insulating housing, a plurality of terminals, a shell and an ejecting mechanism. The insulating housing defines a base, a corner portion juxtaposed with the base and a guiding plate extending forwardly from the corner portion. The terminals are received in the base of the insulating housing. The shell covers the insulating housing to define a card slot and a card insertion direction. The guiding plate of the insulating housing extends in the card slot in a particular direction intersecting the insertion direction. The ejecting mechanism has an ejecting member to be engaged with the card and move together with the card, a pushing member for moving the ejecting member towards the removing direction, a rotary member placed on the corner portion and having a rotation center and rotatable around the rotation center. The rotation center is disposed on the corner portion.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Embodiments of the present invention will now be described going with FIG. 1 to FIG. 5.

Figure 1:
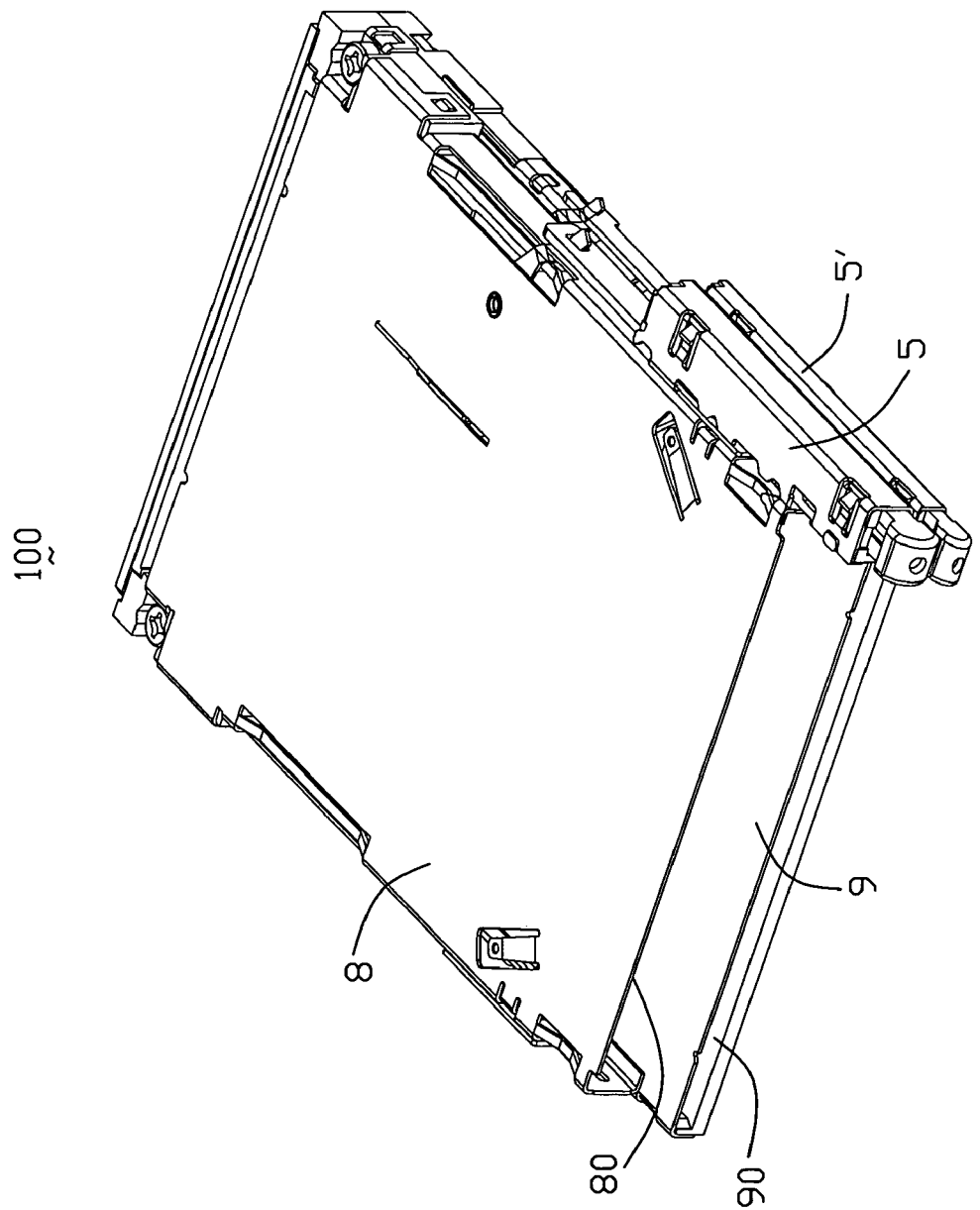
FIG. 1 is a perspective, assembly view of a card connector in accordance with the present invention.
Figure 2:
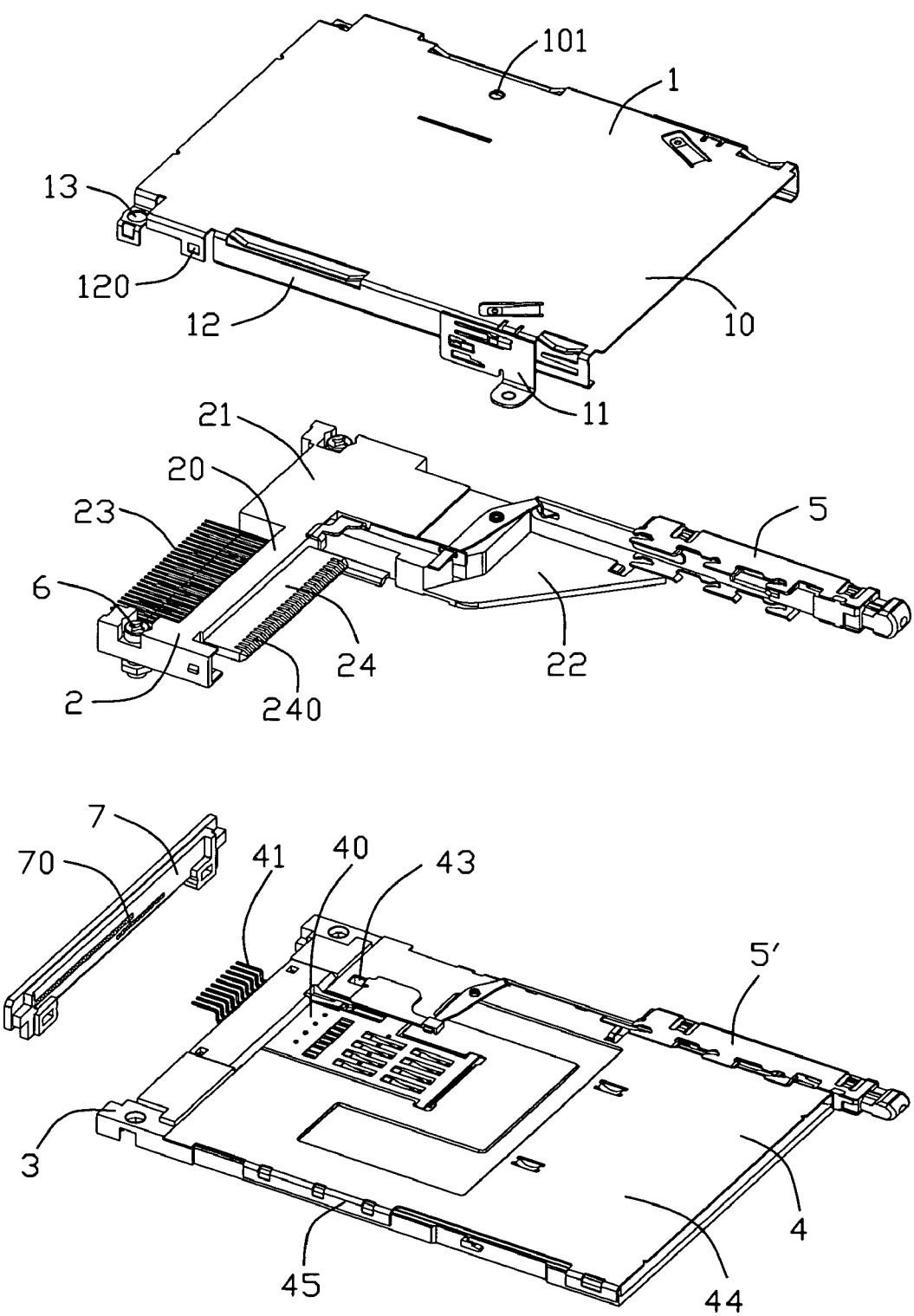
FIG. 2 is an exploded view of the card connector as shown in FIG. 1.

As shown in FIG. 1 to FIG. 2, a card connector 100 in accordance with the present invention, adapted to receive two different cards, comprises a first connector 8, a second connector 9 located under the first connector 8, a medium plate 7 mounted at the rear end of the card connector 100, a first ejecting mechanism 5 and a second mechanism 5' located on a lateral side of the first connector 8 and the second connector 9, respectively. On the medium plate 7, two rows terminal holes 70 are disposed in a transverse line. The card connector 100 further has a pair of standing portions 11 placed on the lateral sides thereof for loading the card connector 100 on a printed circuit board (not shown).

The first connector 8 comprises a first shell 1, a first insulating housing 2 and a plurality of first terminals 23 going through the first insulating housing 2. The first shell 1 is mounted on the first insulating housing 2, thereby, a first card slot 80 is defined to guide a card insertion. The first card slot 80, structured approximately as an L shape, is divided into a wider front portion (not labeled) and a narrower back portion (not labeled).

The first shell 1, approximately a rectangular figure, comprises a body plate 10 and a pair of lateral walls 12 extending downwardly from the body plate 10. Lean to one side of the body plate 10, a position hole 101 is defined. A pair of side plates (not labeled) are disposed with a locking hole 120 near to the lateral wall 12, respectively. At the opposite ends of the body plate 10, a pair of tending plates (not labeled) are provided with a screw hole 13, respectively.

Figure 3:
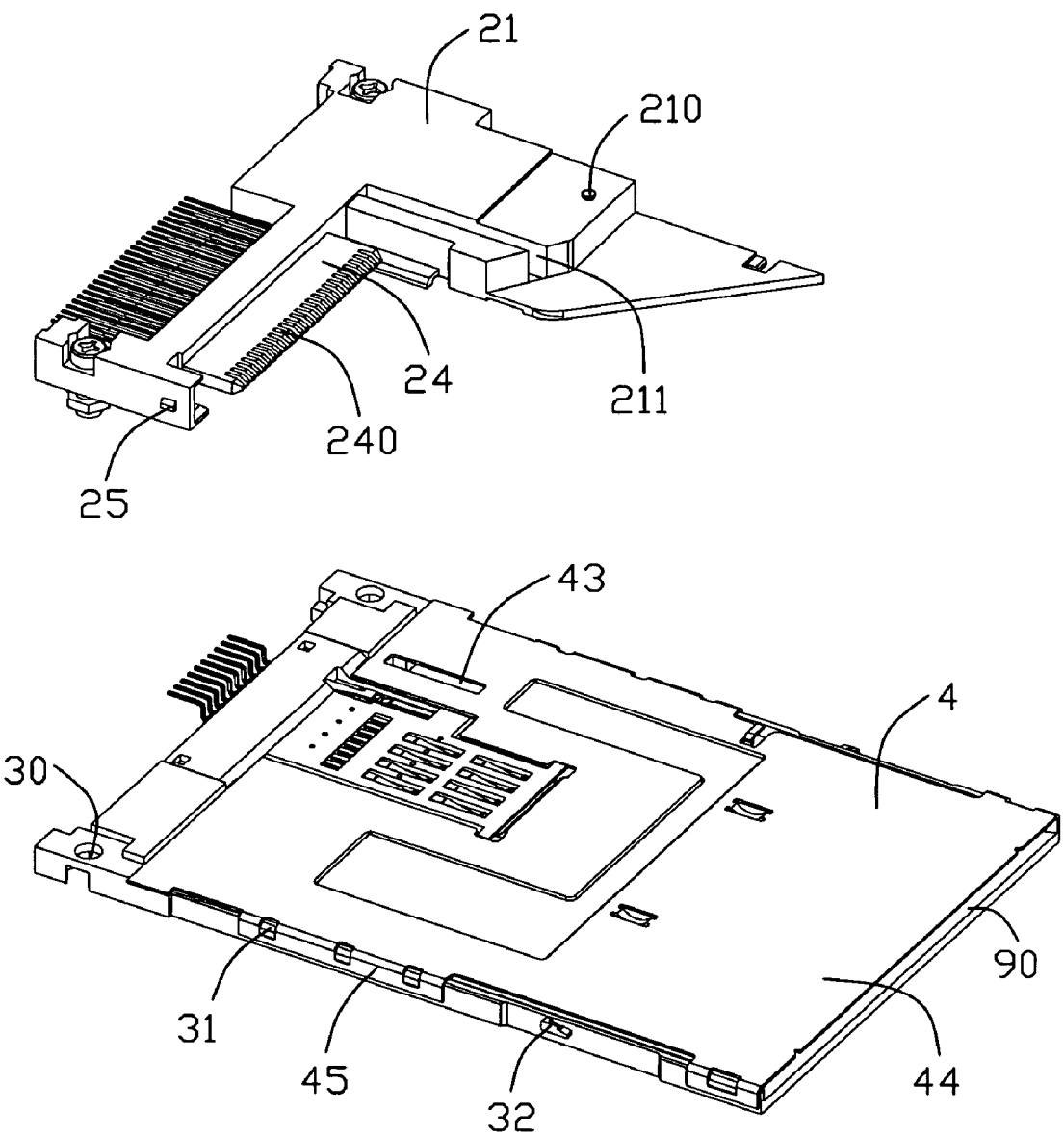
FIG. 3 is a perspective view of a first insulating housing and a second connector of the card connector in accordance with the present invention.

As shown in FIG. 2 and FIG. 3, the first insulating housing 2 comprises a transverse base section 20, an engaging plate 24 extending forwardly from the base section 20, a corner portion 21 extending laterally from a side of the base section 20 and a guiding plate 22 extending forwardly from the corner portion 21. In this case, the corner portion 21 and the base section 20 are juxtaposed with each other from an elevational view. The engaging plate 24 has a plurality of receiving holes 240, the first terminals 23 go through the receiving holes 240, thereafter, protrude into the first card slot 80 to engaging with an inserted card. Corresponding to the position hole 101 of the shell 1, a combing section 210 is formed on the corner portion 21. Near to the base section 20, a groove 211 is disposed on the corner portion 21 extending in a card insertion or withdrawing direction, and one end thereof communicates with the first card slot 80. According to the screw holes 13 of the shell 1, a pair of holes (not labeled) are formed on the opposite ends of the base section 30, respectively. In addition, an embossment 25 is formed on the lateral side of the base section 20 and the corner portion 21, respectively. The base section 20, the guiding plate 22 and the corner portion 21 are integral. Further, the guiding plate 22 extends in the card slot 80 in a particular direction intersecting the insertion direction.

Essentially, the first connector 8, structured as a rectangular housing, the width of the housing is equivalent to that of the wider portion of the card slot 80. Therefore, the first shell 1 can use a same module of a PC card connector.

Continuing with FIG. 2 and FIG. 3, the second connector 9 will be described. The second connector 9 has a second shell 4, a second insulating housing 3, a terminal module 40 mounted on the second insulating housing 3 and a plurality of second terminals 41 retained in the terminal module 40. The second insulating housing 3 combines with the second shell 4 defining a second card slot 90 for a second card insertion. The second terminals 41 are arranged in two rows along a card insertion direction, and protruding into the second card slot 90 to engaging with the second card.

The second shell 4 comprises an apart portion 44 and a pair of side walls 45 extending downwardly from the opposite sides of the apart portion 44. Each side wall 45 has a plurality of holes (not labeled), accordingly, a plurality of embossments (not labeled) are formed on the opposite sides of the second insulating housing 3 to lock with the holes. Adjacent to one side of the terminal module 40, a sliding channel 43 is defined extending along a card insertion direction. Corresponding to the screw hole of the first insulating housing 2, a pair of screw holes 30 are defined on the opposite ends of the second insulating housing 3.

Figure 4:
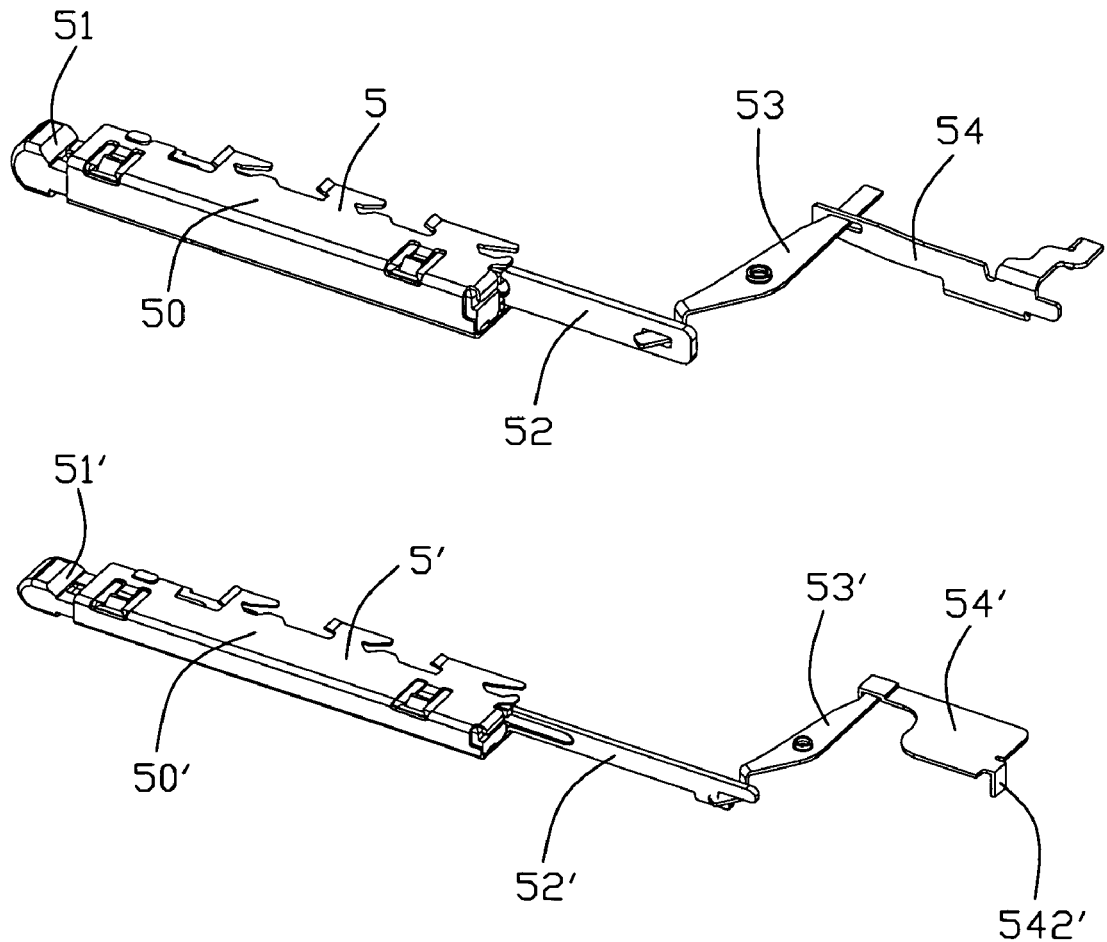
FIG. 4 is a perspective view of a first ejecting mechanism and a second mechanism of the card connector in accordance with the present invention.
Figure 5:
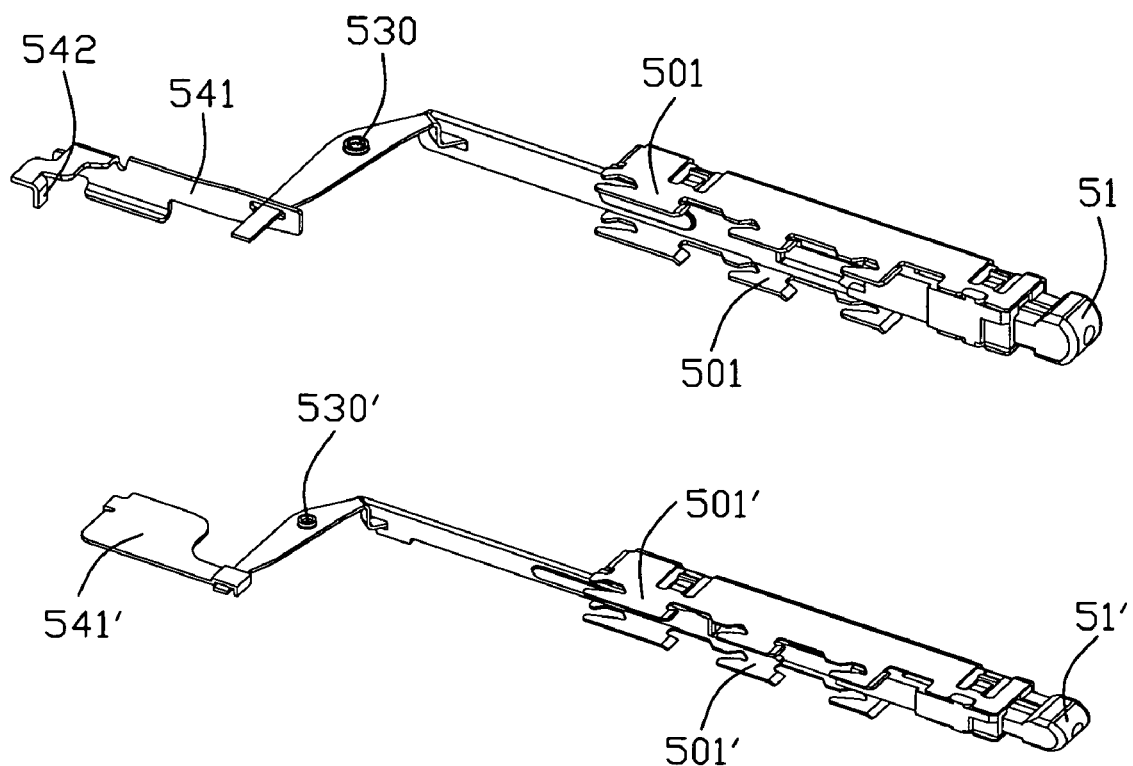
FIG. 5 is a perspective view of the first ejecting mechanism and the second mechanism of the card connector from another aspect as shown in FIG. 4.

As shown in FIG. 4 and FIG. 5, the structure of the first ejecting mechanism 5 and the second ejecting mechanism 5' are almost the same. The first ejecting mechanism 5 and the second mechanism 5' comprises, respectively, a bracket 50, 50', a pushing member 51, 51' surrounded by corresponding brackets 50, 50', a subordinating member 52, 52' actuated by corresponding pushing member, a rotary member 53, 53' and an ejecting member 54, 54'. In the bracket 50, 50', a limiting section (not shown) is formed, respectively, for dominating the push member 51, 51' and the subordinating member 52, 52' moving. A plurality of stabbing pieces 501, 501' are provided on the upper portion and the lower portion of the bracket 50, 50', respectively. On the rotary member 53, 53', an axis part 530, 530' is formed according with the combining section 210 of the first insulating housing, respectively. The ejecting member 54, 54' has a pushing section 542, 542' protruding into the first card slot 80 and the second card slot 90, and a joining section 541, 541' connecting the ejecting member 54, 54' with the rotary member 53, 53', respectively. The pushing member 542, 542' are capable of engaging with corresponding card directly.

Together with FIG. 1 to FIG. 5, the relationship of the elements of the card connector 100 as described above will be illustrated in flowing segment. The first ejecting mechanism 5 is placed at one side of the first insulating housing 2, with the rotary member 53 fixed on the corner portion 21 rightly, the ejecting member 54 mounted in the groove 211, thereafter, the pushing section 542 protruding into the first card slot 80. Upon the setting manner, a rotation center (shown in FIG. 1) is formed by the axis 530 of the rotary member 53 mating with the position hole 101 of the first shell 1 and the combining section 210 of the corner portion 21, then the rotary member 53 is capable of rotating around the rotation center. When the first card is ejected, promoting the pushing member 51 in the card insertion direction, then the subordinating member 52 is actuated to make the rotary member 53 rotate with one end moving backwardly and the other engaging with the ejecting member 54 moving forwardly, so the pushing portion 542 moving forwardly. Therefore, the card is ejected.

The second ejecting mechanism 5' is assembled at a side of the second connector 9 and under the first ejecting mechanism 5, with the axis 530' of the rotary member 53 retained in a corresponding position hole (not shown) formed on the bottom surface of the corner portion 21. The pushing section 542' goes through the channel 43 and projecting into the second card slot 90. The second card is pushed in the same way of the first card as described above. So it is unnecessary to describe the ejecting process of the second card.

The first shell 1 is mounted on the first insulating housing 2 with the hole 120 locking with the embossment 25, at the same time, the stabbing pieces 501 is locked in corresponding gap (not labeled) defined on the first shell 1. The medium plate 7 is located at the rear end of the card connector 100 with the first terminals 23 and the second terminals 41 going through. Finally, the screws 6 go through the screws holes of the first shell 1, the first insulating housing 2 and the second insulating housing 3 in turn to fasten the first connector 8 with the second connector 9 together.

The card connector in this embodiment is designed to receive two kinds of cards, accordingly with two ejecting mechanisms partially exposed out of the card connector. In other embodiment, a card connector, designed to receive one card, can also be fixed one of the ejecting mechanisms as described above.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A card connector comprising:
   an insulating housing defining a base, a corner portion juxtaposed with the base and a guiding plate extending forwardly from the corner portion;
   a plurality of terminals received in the base of the insulating housing;
   a shell covering the insulating housing to define a card slot and a card insertion direction, the guiding plate of the insulating housing extending in the card slot in a direction intersecting the insertion direction; and
   an ejecting mechanism assembled on a side of the shell for moving an inserted card towards a removing direction opposite to the insertion direction, the ejecting mechanism comprising:
   an ejecting member placed at one lateral side of the insulating housing and protruding into the card slot to engage with the card;
   a pushing member mounted at one side of the shell; and
   a rotary member having two ends connecting with the ejecting member and the pushing member, respectively, and placed on the corner portion and being rotatable around a rotation center thereof, the rotation center being disposed on the corner portion;
   wherein the ejecting member and the pushing member linked at two opposite ends of the rotary member in a Z-shaped manner.

2. The card connector as claimed in claim 1, wherein the rotation member is a lever-like member.

3. The card connector as claimed in claim 1, wherein the shell is structured as a rectangle.

4. The card connector as claimed in claim 1, wherein the corner portion defines a groove extending along the card insertion direction, and the ejecting member is located in the groove.

5. The card connector as claimed in claim 1, wherein the card slot is L-shaped to selectively guiding insertion of two types of cards with different shape.

6. The card connector as claimed in claim 1, wherein the upper surfaces of the guiding plate and the corner portion are located at different levels.

7. A card connector, adapted to connect with two cards inserted along an insertion direction, comprising:
a first connector defining a corner portion and a first card slot to guide an insertion of a selected one of the cards, the corner portion being placed at a lateral side of the first card slot in the insertion direction, the first card slot comprising a front portion for a card inserted and a back portion opposite to the front portion;
a second connector stacked with the first connector and defining a second card slot to guide an insertion of a selected one of the cards; and
a pair of ejecting mechanism mounted on corresponding side of the first card connector and the second connector, each comprising:
an ejecting member placed at one side of the back portion of the first card slot to engage with the inserted card;
a pushing member mounted at one lateral side of the front portion of the first card slot; and
a rotary member with two ends, respectively, connecting with the ejecting member and the pushing member;
wherein the ejecting member, the rotary member and the pushing member form in a Z-shaped manner;
wherein a rotation center is formed on the corner portion, the rotary members are placed on the opposite faces of the corner portion and rotatable around the rotation center.

8. The card connector as claimed in claim 7, wherein the front portion of the first card slot is wider than that of the back portion.

9. The card connector as claimed in claim 7, wherein the second housing comprises a terminal module retaining two rows of terminals arranged along the card insertion direction.

10. The card connector as claimed in claim 9, wherein the first connector is structured as a rectangle.

11. The card connector as claimed in claim 7, wherein a medium plate is located between the first connector and the second connector.

12. A card connector assembly comprising:
stacked upper and lower connector ports;
wherein each of the connector ports comprising:
an insulating housing defining a base, a corner portion juxtaposed with the base and a guiding plate extending forwardly from the corner portion;
a plurality of terminals received in the base of the insulating housing;
a shell covering the insulating housing to define a card slot and a card insertion direction, the guiding plate of the insulating housing extending in the card slot in a direction intersecting the insertion direction;
an upper ejection mechanism assembled on a side of the shell of the upper port defining an upper pivotal member with an upper pushing member and an upper ejection member linked at two opposite ends thereof in a Z-shaped manner;
a lower ejection mechanism assembled on a side of the shell of the lower port defining a lower pivotal member with a lower pushing member and a lower ejection member linked at two opposite ends thereof in said Z-shaped manner;
wherein a center of the upper pivotal member is placed on the corner of the housing of the upper port;
wherein a center of the lower pivotal member is placed on the corner of the housing of the lower port;
said upper ejection mechanism and said lower ejection mechanism being configured to be similar to each other and located at a similar position in the corresponding connector ports except that the upper ejection mechanism defines an upper pushing section, for ejecting a corresponding upper card, located at an laterally innermost position in comparison with the upper ejection member and the upper pushing member while the lower ejection mechanism defines a lower pushing section, for ejecting a corresponding lower card, essentially located laterally between the lower ejection member and the lower pushing member.

* * * * *